(12) United States Patent
Park

(10) Patent No.: US 6,355,548 B1
(45) Date of Patent: Mar. 12, 2002

(54) METHOD FOR MANUFACTURING A GATE STRUCTURE INCORPORATED THEREIN A HIGH K DIELECTRIC

(75) Inventor: Dae-Gyu Park, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,465

(22) Filed: Nov. 28, 2000

(30) Foreign Application Priority Data

Dec. 22, 1999 (KR) .............................. 99-60547

(51) Int. Cl.$^7$ .......................................... H01L 21/3205
(52) U.S. Cl. ...................... 438/591; 438/261; 438/287; 438/299
(58) Field of Search ................................ 438/240, 261, 438/263, 264, 287, 299, 509, 584, 585, 591, 594

(56) References Cited

U.S. PATENT DOCUMENTS

| 5,707,901 A | * | 1/1998 | Cho et al. ................... 438/595 |
| 6,200,866 B1 | * | 3/2001 | Ma et al. ..................... 438/299 |
| 6,208,000 B1 | * | 3/2001 | Tanamoto et al. .......... 257/402 |

* cited by examiner

*Primary Examiner*—Keith Christian
*Assistant Examiner*—Jack Chen
(74) *Attorney, Agent, or Firm*—Finnegan, Henderson, Farabow, Garrett & Dunner, L.L.P.

(57) ABSTRACT

A method for forming a gate structure begins by preparing a semiconductor substrate provided with an isolation region formed therein. An AlN layer is formed on top of the semiconductor substrate and annealed in the presence of oxygen gas to convert into an $Al_2O_3$ layer. Thereafter, a conductive layer is formed on top of the $Al_2O_3$ layer. Finally, the conductive layer and the $Al_2O_3$ layer are patterned into the gate structure.

26 Claims, 1 Drawing Sheet

METHOD FOR MANUFACTURING A GATE STRUCTURE INCORPORATED THEREIN A HIGH K DIELECTRIC

CROSS-REFERENCE TO RELATED APPLICATION

Priority is claimed from Republic of Korean Patent Application No. 99-60547 filed Dec. 22, 1999, which is incorporated in its entirety by reference.

1. Field of the Invention

The present invention relates to a semiconductor device; and, more particularly, to a method for manufacturing a gate structure incorporated therein a high K dielectric.

2. Description of the Prior Art

As is well known, a semiconductor device has been down-sized by a scale down of a design rule. Therefore, a gate oxide tends to rapidly approach 30 Å in thickness and below to increase the capacitance between a gate electrode and a channel region. However, the use of silicon dioxide as a gate dielectric is limited at this thickness and below. Once silicon dioxide is formed to a thickness of less than 40 angstroms, direct tunneling may occur through the gate dielectric to the channel region, thereby increasing a leakage current associated with the gate electrode and the channel region, causing an increase in power consumption.

Since reducing the thickness of the gate dielectric inherently increases the gate-to-channel leakage current, alternative methods have been developed to reduce this leakage current while maintaining thin $SiO_2$ equivalent thickness. One of these methods is to use a high K dielectric material such as $Ta_2O_5$ as the gate dielectric materials to increase the capacitance between the gate and the channel.

However, if a poly-silicon is utilized as a gate electrode, the use of $Ta_2O_5$ for gate dielectric materials has a disadvantage in integrating the semiconductor device. That is, an undesired $SiO_2$ is formed at an interface between $Ta_2O_5$ and the poly-silicon, which, in turn, increases an equivalent oxide thickness. In order to overcome this problem, a barrier metal such as TiN is employed. However, the TiN makes a threshold voltage shift changed.

Therefore, there is still a demand for developing a high K dielectric as a gate oxide with excellent leakage current as well as a low interface state with both a gate electrode and a silicon substrate.

SUMMARY OF THE INVENTION

It is, therefore, an object of the present invention to provide a method for manufacturing a gate structure incorporated therein a high K dielectric for use in a semiconductor device.

In accordance with one aspect of the present invention, there is provided a method for manufacturing a gate structure for use in a semiconductor device, the method comprising the steps of: a) preparing a semiconductor substrate provided with an isolation region formed therein; b) forming an aluminum nitride (AlN) layer on top of the semiconductor substrate; c) annealing the AlN layer to convert into an $Al_2O_3$ layer; d) forming a conductive layer on top of the $Al_2O_3$ layer; and e) patterning the conductive layer and the $Al_2O_3$ layer into the gate structure.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
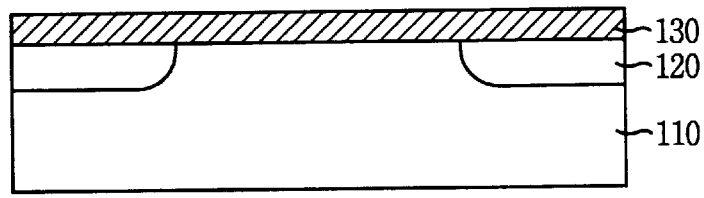
FIGS. 1 to 3 are schematic cross sectional views setting forth a method for the manufacture of a gate structure incorporated therein a high K dielectric in accordance with the present invention.
Figure 2:
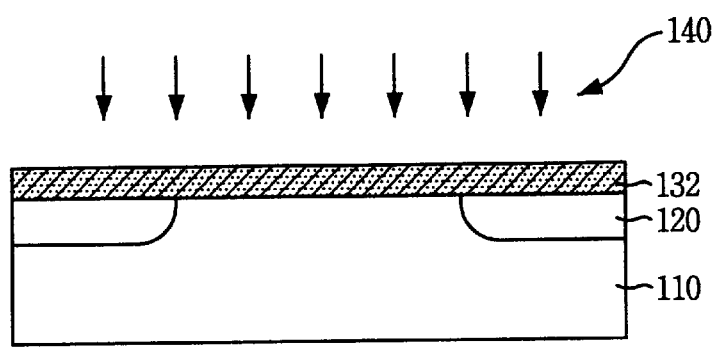
Figure 3:
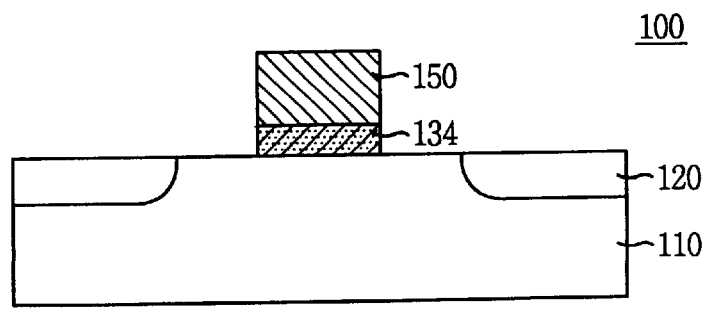

There are provided in FIGS. 1 to 3 cross sectional views setting forth a method for manufacturing a gate structure 100 for use in a semiconductor device in accordance with preferred embodiments of the present invention.

Referring to FIG. 1, the process for manufacturing the gate structure 100 begins with the preparation of a semiconductor substrate 110 including an isolation region 120 for defining an active region. The isolation region 120 may be formed in a structure of local oxidation of silicon (LOCOS) or in a structure of shallow trench isolation (STI).

And then, the semiconductor substrate 110 can be cleaned by using a chemical such as a piranha at a hydrogen gas atmosphere to remove an undesired silicon dioxide ($SiO_2$) formed thereon. Alternatively, it is possible that the semiconductor substrate 110 can be cleaned by a solution, which the solution is prepared by mixing ammonium hydroxide ($NH_4OH$), hydrogen peroxide ($H_2O_2$) and deionized (DI) water. It is preferable that the cleaning process is carried out at a temperature ranging from approximately 850° C. to approximately 950° C. in ultra high vacuum (UHV).

Thereafter, an AlN layer 130 is formed on top of the semiconductor substrate 110 by using a reactive ion sputtering as shown in FIG. 2. In the preferred embodiment, the reactive ion sputtering is carried out in a radio frequency (RF) glow plasma to remove nitrogen vacancies from the AlN layer 130 and utilizes $N_2$/Ar gas and a pure Al target as a source. The RF glow plasma is achieved by a pulse power supply between a cathode and an anode. The pure Al target can be replaced by a doped Al target, which is made with a specific dopant Si. An $N_2$ flow rate is ranged from approximately 10 standard cubic centimeter per minute (sccm) to approximately 100 sccm, an Ar flow rate is ranged from approximately 10 sccm to approximately 45 sccm and a deposition temperature is ranged from approximately -25° C. to approximately 750° C. A power density of the RF glow plasma is ranged from approximately 100 W to approximately 5,000 W for 8 inches wafer. The thickness of the AlN layer 130 is ranged from approximately 15 Å to approximately 100 Å. The AlN layer 130 can be formed by using a DC magnetron sputtering. In this case, it is preferable that a power density of DC magnetron plasma is ranged from approximately 100 W to approximately 5,000 W for 8 inches wafer and an AlN target is utilized as a source.

In the next step, the AlN 130 is annealed at a temperature ranging from approximately 450° C. to approximately 850° C. in an oxygen gas atmosphere to convert a dangled Al into aluminum oxide ($Al_2O_3$), thereby obtaining an $Al_2O_3$ layer 132.

In an ensuing step, a conductive material such as a poly-silicon is formed on top of the $Al_2O_3$ layer 132 as shown in FIG. 3. The conductive material can be made of a polycide selected from a group consisting of W-polycide, Ti-polycide, Mo-polycide or the like.

In a following step, the conductive material and the $Al_2O_3$ layer 132 are patterned into a predetermined configuration, thereby obtaining a gate electrode 150 and a gate dielectric 134.

Although the invention has been described with reference to the specific embodiment, it is not intended that the invention be limited to the illustrative embodiment. That is, the formation of the AlN layer 130 can be formed by using a sputtering which utilizes an Ar gas and AlN as a target. And also, a chemical vapor deposition (CVD) utilizing an inorganic material as a source can be employed in order to form the AlN layer 130. In this case, a material selected from a group consisting of $AlCl_3$, di methyl aluminum hydride (DMAH), $NH_3$, hydrogen ($H_2$) or nitrogen ($N_2$) is utilized as a precursor and a deposition temperature is ranged from approximately 450° C. to approximately 750° C. In addition, if a CVD utilizes a metal organic material as a source, a material selected from a group consisting of tri methyl aluminum (TMA), $NH_3$, $H_2$ or $N_2$ as a precursor.

While the present invention has been described with respect to the particular embodiments, it will be apparent to those skilled in the art that various changes and modifications may be made without departing from the scope of the invention as defined in the following claims.

What is claimed is:

1. A method for manufacturing a gate structure for use in a semiconductor device, the method comprising:
    a) preparing a semiconductor substrate provided with an isolation region formed therein;
    b) forming an aluminum nitride (AlN) layer on top of the semiconductor substrate;
    c) annealing the AlN layer to convert the AlN layer into an aluminum oxide ($Al_2O_3$) layer;
    d) forming a conductive layer on top of the $Al_2O_3$ layer; and
    e) patterning the conductive layer and the $Al_2O_3$ layer into the gate structure.

2. The method of claim 1, wherein forming the AlN layer comprises using a low density glow plasma to remove nitrogen vacancies from the AlN layer.

3. The method of claim 1, wherein annealing the AlN layer comprises annealing at a temperature ranging from approximately 450° C. to approximately 850° C. in an oxygen gas atmosphere for approximately 30 minutes to convert a dangled Al into $Al_2O_3$.

4. The method of claim 1, wherein the isolation region is in the form of one of a local oxidation of silicon (LOCOS) or a shallow trench isolation (STI).

5. The method of claim 1, further comprising, subsequent to said preparing, cleaning a surface of the semiconductor substrate by using a chemical to remove an undesired silicon dioxide ($SiO_2$).

6. The method of claim 5, wherein the chemical is a piranha.

7. The method of claim 5, wherein the chemical is prepared by mixing ammonium hydroxide ($NH_4OH$), hydrogen peroxide ($H_2O_2$) and deionized (DI) water.

8. The method of claim 5, wherein the cleaning comprises cleaning a temperature ranging from approximately 850° C. to approximately 950° C. in ultra high vacuum (UHV).

9. The method of claim 5, wherein the cleaning comprises cleaning in a hydrogen gas atmosphere.

10. The method of claim 5, wherein forming the AlN layer comprises using a reactive sputtering which utilizes $N_2/Ar$ gas and a pure Al as a target.

11. The method of claim 10, wherein the reactive sputtering comprises using a radio frequency (RF) glow plasma.

12. The method of claim 11, wherein a power density of the RF glow plasma ranges from approximately 100 W to approximately 5,000 W for an 8 inch wafer.

13. The method of claim 10, wherein the reactive sputtering comprises using a direct current (DC) magnetron plasma.

14. The method of claim 13, wherein a power density of the DC magnetron plasma ranges from approximately 100 W to approximately 5,000 W for an 8 inch wafer.

15. The method of claim 10, wherein an $N_2$ flow rate ranges from approximately 10 sccm to approximately 100 sccm, an Ar flow rate ranges from approximately 10 sccm to approximately 45 sccm and a deposition temperature ranges from approximately −25° C. to approximately 750° C.

16. The method of claim 5, wherein forming the AlN layer comprises using a reactive sputtering which utilizes doped Al as a target.

17. The method of claim 16, wherein the doped Al is doped with Si.

18. The method of claim 1, wherein a thickness of the AlN layer ranges from approximately 15 Å to approximately 100 Å.

19. The method of claim 1, wherein annealing the AlN layer comprises using a rapid thermal process (RTP) at a temperature ranging from approximately 450° C. to approximately 900° C. in a presence of oxygen gas for approximately 30 minutes.

20. The method of claim 1, wherein preparing the semiconductor substrate comprises using a sputtering which utilizes Ar gas and AlN as a target.

21. The method of claim 1, wherein preparing the semiconductor substrate comprises using a chemical vapor deposition (CVD) method which utilizes an inorganic material as a source.

22. The method of claim 21, wherein the CVD method utilizes as a precursor at least one material selected from a group consisting of $AlCl_3$, di methyl aluminum hydride (DMAH), $NH_3$, hydrogen ($H_2$), and nitrogen ($N_2$).

23. The method of claim 22, wherein the CVD method comprises using a temperature ranging from approximately 450° C. to approximately 750° C.

24. The method of claim 1, wherein preparing the semiconductor substrate comprises using a CVD method which utilizes a metal organic material as a source.

25. The method of claim 24, wherein the CVD method comprises using as a precursor at least one material selected from a group consisting of trimethyl aluminum (TMA), $NH_3$, hydrogen ($H_2$), and nitrogen ($N_2$).

26. The method of claim 1, wherein the gate structure comprises at least one material selected from a group consisting of a poly-silicon, W-polycide, Ti-polycide, Mo-polycide, and W.

* * * * *